(12) United States Patent
Shofman et al.

(10) Patent No.: US 7,847,268 B2
(45) Date of Patent: Dec. 7, 2010

(54) THREE MODES PARTICLE DETECTOR

(75) Inventors: Semyon Shofman, Qiriat Ekron (IL); Eli Cheifetz, Ramat-Gan (IL); Armin Schon, Nes-Ziona (IL); Eitan Pinhasi, Jerusalem (IL)

(73) Assignee: El-Mul Technologies, Ltd., Yavne (IL)

( * ) Notice: Subject to any disclaimer, the term of this patent is extended or adjusted under 35 U.S.C. 154(b) by 364 days.

(21) Appl. No.: 12/155,233

(22) Filed: May 30, 2008

(65) Prior Publication Data

US 2009/0294687 A1 Dec. 3, 2009

(51) Int. Cl.
*H01J 3/14* (2006.01)
*G21K 1/08* (2006.01)

(52) U.S. Cl. ............... 250/397; 250/310; 250/398; 250/399; 250/396 R; 250/491.1

(58) Field of Classification Search .......... 250/397, 250/398, 399, 396 R, 310, 491.1
See application file for complete search history.

(56) References Cited

U.S. PATENT DOCUMENTS 7,009,187 B2 *   3/2006   Gerlach et al. .......... 250/397
7,417,235 B2 *   8/2008   Schon et al. ............. 250/397
2008/0308742 A1 * 12/2008 Gerlach et al. .......... 250/397

* cited by examiner

*Primary Examiner*—Nikita Wells
(74) *Attorney, Agent, or Firm*—Bacon & Thomas, PLLC

(57) ABSTRACT

The invention discloses a charged particle detecting apparatus for detecting positive ions, negative ions and electrons emitted from a sample, the apparatus comprising a housing, defining a chamber in its interior, which is confined by conductive walls, and has an opening to the outside of said housing; a grid for selectively attracting charged particles, wherein the grid is electrically biasable with respect to said housing and functionally aligned with said opening; a converter arrangement with a converter surface, which is electrically biasable with respect to the grid and with respect to the housing, and which is positioned such that charged particles attracted into the chamber by the grid impact on the converter surface; an electron detector, which is biasable with respect to the converter surface in such a way that electrons emitted from the converter surface impact on the electron detector.

16 Claims, 3 Drawing Sheets

THREE MODES PARTICLE DETECTOR

TECHNICAL FIELD OF THE INVENTION

The present invention relates to a particle detector for focused ion beam (FIB) and dual beam (FIB+SEM) and similar ion and electron beam tools that has three modes of detection: Electrons, positive ions and negative ions.

BACKGROUND OF THE INVENTION

When a focused ion beam hits a sample, ions and electrons, commonly referred to as particles, are emitted from the interaction spot between the sample and the focused ion beam. Detecting the emitted particles is useful in analyzing and imaging the sample. Particle detectors, which can detect both positive and negatively charged particles, are described by: Strausser—U.S. Pat. No. 3,538,328; Gerlach et al.—U.S. Pat. No. 7,009,187; Ishitani Toru et al.—Japanese Patent Application Publication No. 07142022 A.

These detectors comprise a scintillator member, which is excited by electrons that either are emitted from the sample or are generated by conversion by an ion-to-electron converter. The converter is designed in such a way that positive ions impact the surfaces of an ion-to-electron converter such that secondary electrons are emitted from the converter surfaces, but negatively charged particles bypass the converter surfaces without impacting them. However, if negative ions fly through such a detector, they hit directly the scintillator surface and shorten its life. Therefore, there is a need for a detector that is capable to detect negative ions without compromising its service life.

Moreover, since the converter can amplify the number of particles emitted vs. the number of particles impinging, it would be an advantage, if the converter is capable of converting not only positive and negative ions to electrons, but also for converting primary electrons originating from the sample to secondary electrons, thereby amplifying the number of electrons too.

SUMMARY OF THE INVENTION

In view of the above, it is an object of the invention to provide a particle detecting apparatus that can operate in three modes: positive ion detection, negative ion detection and electron detection, by converting ions and primary electrons to secondary electrons, and to provide a method to detect the above three types of particles.

The object is solved by the charged particle detecting apparatus according to claim 1 and the method of claim 14.

The invention provides a charged particle detecting apparatus for detecting particles emitted from a sample, said particles comprising positive ions, negative ions and electrons, the detecting apparatus comprising: a housing, said housing defining a chamber in its interior, said chamber confined by conductive walls, said chamber having an opening to the outside of said housing; a grid for selectively attracting charged particles, wherein the grid is electrically biasable with respect to said housing, and wherein the grid is functionally aligned with said opening; a converter arrangement having at least one converter surface, said converter surface being electrically biasable with respect to the grid and with respect to the housing, wherein the converter surface is positioned with respect to the grid and the opening in such a way that particles attracted into the chamber by the grid impact on the converter surface; an electron detector, wherein the electron detector is biasable with respect to the converter surface in such a way that electrons emitted from the converter surface are accelerated towards the electron detector and impact on the electron detector.

According to a further aspect of the invention essentially all particles attracted into the chamber by the grid impact on the converter surface.

According to a presently preferred embodiment, the electron detector comprises a scintillator. According to one aspect of the invention, the scintillator may be hidden from direct impact of any of the charged particles entering the chamber. The particle detecting apparatus according to this embodiment preferably comprises a photomultiplier tube, for receiving the light from the scintillator.

According to further aspect of the invention the charged particle detecting apparatus comprises a switchable high voltage power supply, for providing at least two, preferably three, different sets of potentials to bias the grid and the converter arrangement with respect to the housing in order to enable detecting modes for detecting electrons, positive ions, or negative ions respectively. The potentials for each mode are preferably set up to create an efficient attracting force to particles of this mode for guiding each particle that has passed the grid on a trajectory that hits the converter.

The potential between the converter surface and the housing may have a fixed proportion factor relative to the potential between the grid and the housing, wherein said fixed proportion factor may be, for example, between 1 and 3.

According to one embodiment, wherein the grid, the converter, and scintillator may be connected to the power supply by separate high voltage feedthroughs.

According to another embodiment, the grid and converter are connected to a voltage divider which is connected to a high voltage power supply through a single high voltage feedthrough.

According to a further aspect of the invention, the converter may be shaped to minimize spread in the detection efficiency for the charged particles irrespective of their point of impact on the converter surface. The detection efficiency depends on the product of the conversion factor of the particles impacting on the converter surface, i.e. the number of secondary electrons generated per impacting particle, multiplied by the extraction efficiency, i.e. the likelihood that a secondary electron emitted from the converter surface is extracted to impact on the scintillator surface. Since the converter surface cannot be aligned parallel to the surface of the scintillator, it is evident that the field strength of the electrical field for extracting the converted electrons cannot possibly be homogeneous across the surface of the converter, which in turn implies that the extraction efficiency is not homogeneous. Wherein the extraction efficiency is highest, where the converter surface is closest to the scintillator surface, due to the highest field strength.

In order to compensate for this effect, the converter surface is designed in such a way that the conversion factor is lower for areas closer to the scintillator surface and higher for areas further away from the scintillator surface. This can be achieved by a variation of the angle of impact as follows. For a given kinetic energy and particle type, the conversion factor is a function of the angle of impact, of the particle on the converter surface, wherein the conversion factor generally increases from the lowest conversion factor at normal incidence to the highest conversion factors at grazing incidence. E.g. secondary electron yield as a function of angles of incidence increases from 5.27 at normal incidence to 19.75 at 80° away from normal incidence for K bombarding Al2O3 at 29.8 keV (Dietz and Sheffield, Journal of Applied Physics, Vol. 46, p 4361, 1975).

Based on this observation the converter has a concave surface, wherein surface sections with a greater distance to the scintillator are oriented to result in a shallow angle of incidence, while surface section closer to the scintillator surface are oriented to result in a angle of incidence close to normal incidence.

The converter concave shape is designed to allow the maximal penetration of electric field, even to areas further from the scintillator, Close to the converter, the electric field lines are normal to it. A concave shape causes these lines to direct toward the scintillator which increases the extraction efficiency of secondary electrons from this converter.

Thus, the converter can be designed in such a way that the product of the extraction efficiency multiplied by the conversion factor shows little variation over the converter surface, even though the individual factors vary strongly. According to one aspect of the invention, the detection efficiency varies less than a factor of 2 across the surface of the converter, preferably less than a factor of 1.5 and more preferably less than a factor of 1.25. The detection efficiency can drop rapidly at the converter edges since the electric field might not be strong enough and directed correctly toward the scintillator.

The actual shape of the converter surface may be optimized based on particle trajectories, especially simulated trajectories.

The invention provides a method for detecting charged particles, said particles comprising positive ions, negative ions and electrons by means of a charged particle detecting apparatus, especially according to any of the preceding claims, wherein the detecting apparatus has a housing, a grid, a converter arrangement, and an electron detector in said housing, wherein the method comprises:

mounting the charged particle detecting apparatus in a beam chamber, said beam chamber having beam source for focussing an ion or electron beam on a sample target, to cause emission of the charged particles;

electrically grounding the housing with respect to the beam chamber; and selectively applying high voltage potentials to the grid, the converter, and the electron detector depending on the particle type to be detected.

According to a further aspect of the invention, the method enables operating with a set of potentials to the detector's elements where the ratio between the potential connected to the converter and the potential connected to the grid is fixed in all three modes. With this ability and using a fixed voltage divider, a single high voltage power supply can provide the potentials to both the converter and the grid elements. Moreover, it enables to switch the modes by changing the potential of a single bipolar high voltage power source.

The invention is further discussed with reference to the embodiments given in the drawings.

DETAILED DESCRIPTION OF THE PREFERRED EMBODIMENTS

Figure 1:
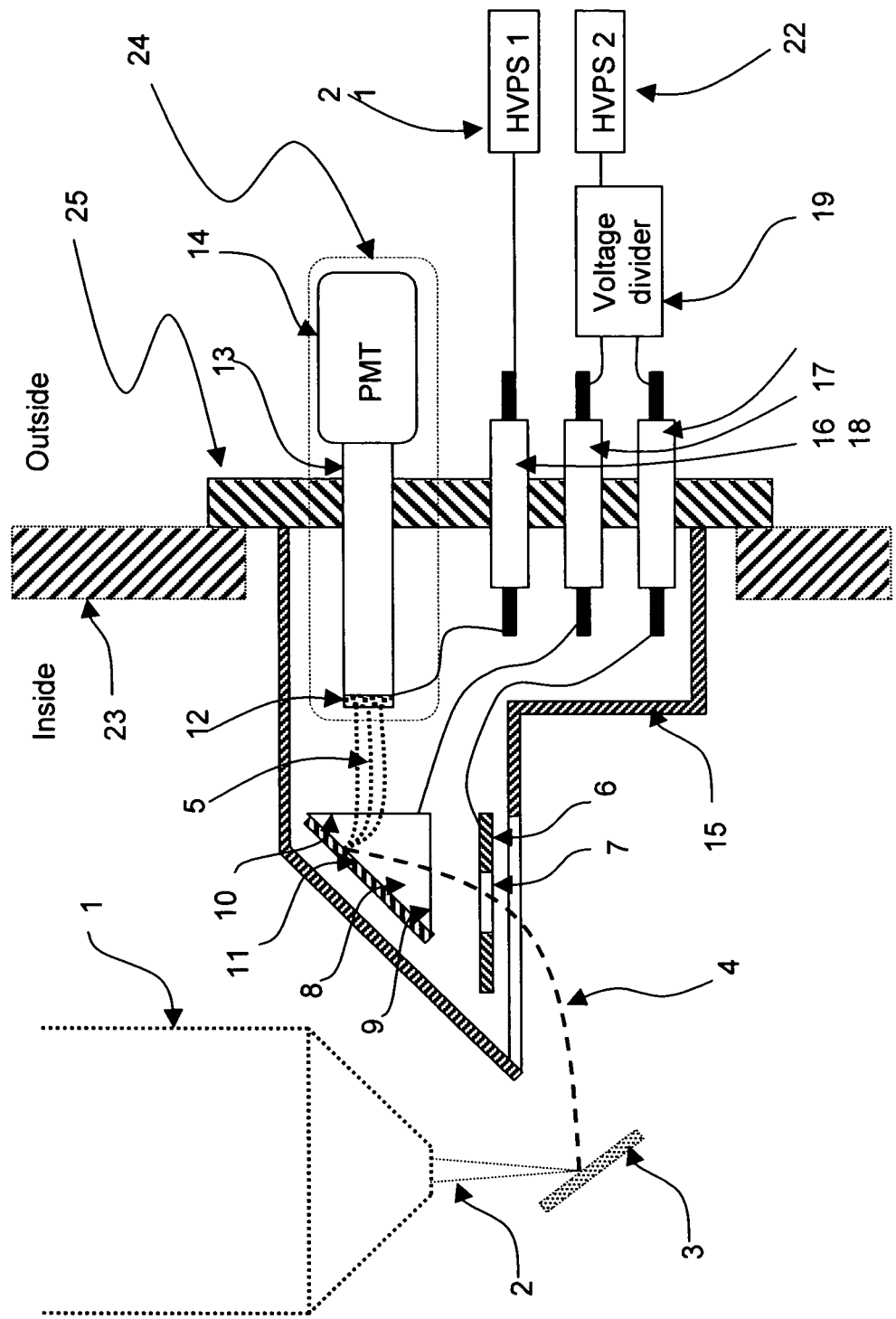
FIG. 1: A cross section of a first embodiment of the apparatus according to the present invention.

FIG. 1 shows a focussed ion beam (FIB) column or dual beam (ions and electrons) column 1, a target sample 3 at which a beam 2 is focused and a Three Modes Particles Detector (TMPD) 25 according to the invention installed in the wall 23 of a FIB chamber The TMPD 25 comprises four isolated elements that are set to different potentials:

1. A housing 15, which is preferably grounded to the instrument chamber.
2. A grid 6, which is set to a potential attracting the selected particles.
3. A converter 8, which is set to a potential that is a constant multiplier of the grid potential. In general this constant has to be greater than 1; in particular when set to 1.4 it gives the best performance with this embodiment.
4. A scintillator detector 24 which has its scintillating surface 12 set to positive high potential typically in the range of 7 kV-12 kV.

Typical potentials in the operating modes of the TMPD are, for example:

Positive ion mode:
Grid −2.7 kV
Converter −3.8 kV
Scintillator +10 kV
Negative ion mode:
Grid +2.7 kV
Converter +3.8 kV
Scintillator +10 kV
Electron mode:
Grid +1.0 kV
Converter +1.4 kV
Scintillator +10 kV For more clarity it will be explained how an electron is detected in electron mode.

Similarly ions are detected in the ion modes.

When a beam 2 is focused on a target sample 3, upon being hit by the beam, particles are emitted from the sample 3 As an electron 4 exits the sample 3, the grid 6 at its positive potential, creates an attracting force that pulls the electron toward an opening 7 in its middle. When the electron passes through this opening, it is attracted by the higher potential of the converter 8. The converter is built like a right triangle were the particles enter through an opening in one of the triangle legs 9 and hit the inside surface of the hypotenuse 11. The converter is made of high second emission material (Aluminum covered by a thin layer of Aluminum Oxide for example). Such a material can easily emit secondary electrons (SE) upon being hit by electrons or ions having appropriate energy. Typically, 3 SE 5 may result per hit. The SE are attracted again by the higher potential surface of the scintillator 12 and fly towards it through an opening in the other triangle leg 10 of the converter 8. This construction of the converter ensures, with a proper voltages choice, that all particles entering the TMPD 25 will be converted to SE before being detected by the scintillator. Therefore this multiplication process enhances the signal from the scintillator, and minimizes the detection noise, as no particle can escape amplification by falling directly onto the electron detector 24. This ensures a narrow Pulse Height Distribution (PHD), as given by the Poisson-like distribution of the conversion process. A narrow PHD is equivalent to low noise and hence good Signal to Noise Ratio (SNR).

The electron detector 24 is implemented in this embodiment by a scintillator detector. The scintillator surface 12 is attached to a light guide 13 that exits out of the chamber 23 and brings the light to a Photo Multiplier Tube (PMT) 14 that detects the light and creates an electric signal.

In order to switch detection modes, only the potentials have to be changed. As can be seen from the potential details given above, the scintillator 12 can be kept at the same potential in all 3 modes. The grid 6 potential and the converter 8 potential need to be changed. However the construction of the elements in the TMPD 25 is designed to enable the use of a fixed ratio between the Grid potential and the Converter potential.

In this embodiment a ratio of 1:1.4 is optimal. This ratio is fixed in all three modes. A single High Voltage Power Supply (HVPS) 22 and a simple voltage divider 19 that divide the power supply potential to both the grid 6 and the converter 8 in this fixed ratio, is used. Therefore it is possible to switch the modes by changing the potential of a single bipolar power supply 22.

FIG. 1 describes an embodiment where the voltage divider is external. Therefore it uses 3 feedthroughs 16, 17, 18:
- One feedthrough 16 provides the scintillation surface 12 the potential of a first HVPS 21.
- Two feedthroughs 17,18 connect the converter 8 and grid 6 to a voltage divider 19 that is powered by a second HVPS 22.

Figure 2:
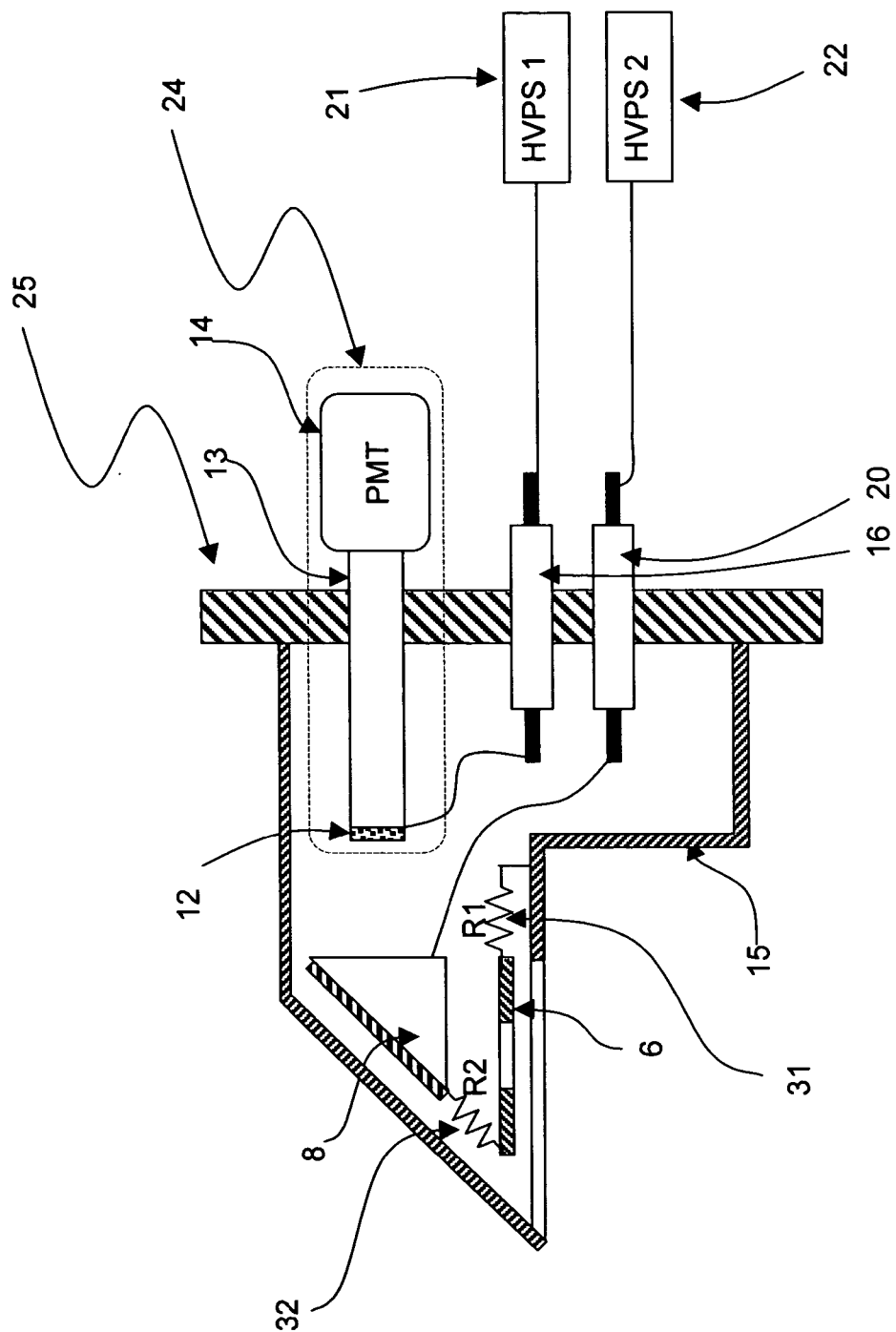
FIG. 2: A cross section of a second embodiment of the apparatus according to the present invention.

FIG. 2 describes an embodiment where the voltage divider is internal. In this embodiment, a resistor 31 R1=2.5 GΩ is connected between the grid 6 and the housing 15, a resistor 32 R2=1 GΩ is connected between the grid 6 and the converter 8, and the converter is connected to a high voltage feedthrough 20. Therefore, this arrangement enables the use of a single high voltage feedthrough 20 for both grid and converter potentials, and therefore replaces feedthrough 17, 18 used in the embodiment described in FIG. 1.

It should be noted that the resistor values given in this embodiment are typical and other values are also applicable.

The detection of the SE is described in this embodiment by a scintillator detector 24. It is an option to use other electron detectors such as a Multi-Channel-Plate (MCP) based detectors for example. However, a scintillator based electron detector has an advantage of longer life. The reason is that both the scintillator surface and the MCP surface are exposed to some contamination in the vacuum chamber. If after a period of use, the surfaces have 20% reduction in their performance, the scintillator based detector will produce 0.8 of its original signal, however, an MCP based detector which has about 10 multiplication cascade on its surface will produce only 0.8 10 (=0.1) of its original signal.

It should be realized by those skilled in the art that modifications to this embodiment that are equivalent are in the scope of this invention; for example: replacing the scintillator detector by a channeltron, by a Multi-Channel-Plate (MCP) by a Solid State Diode (SSD) or other electron detectors. The scintillator detector 24 can also be built in many variations familiar to those skilled in the art, and the construction shown in these embodiments is just an example.

Also if the option to use a single high voltage power supply (HVPS) for the converter and the grid is not desired, and one is willing to use separate HVPS to these elements it is still in the scope of this patent.

The shape of the converter 8 as shown in this embodiments has straight lines contour 9, 10, 11. It is clear that if these lines are curved or the walls have curved surface, it is still in the scope of this invention as long as essentially all the particles that pass in the detector will hit the converter.

Figure 3:
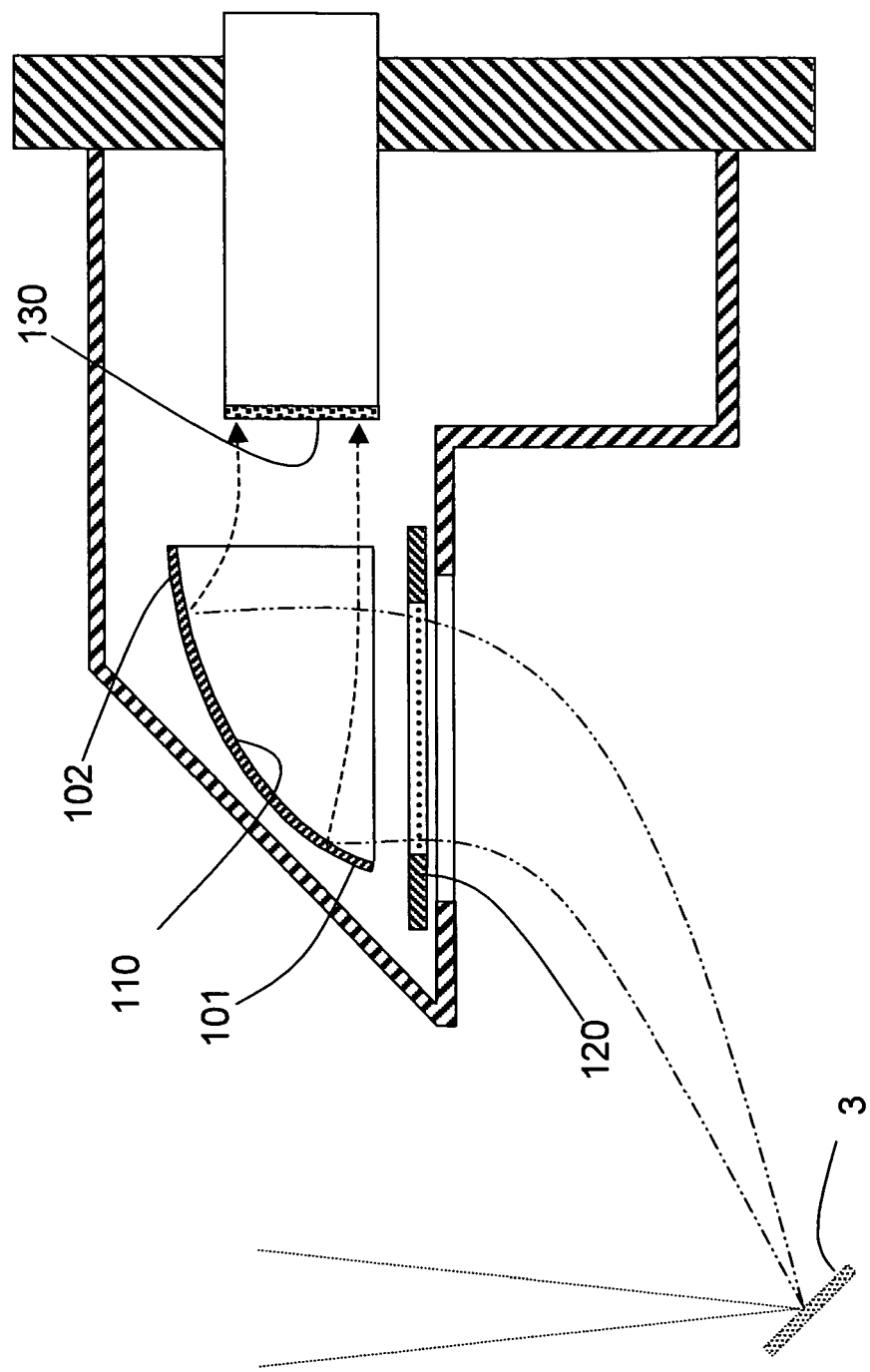
FIG. 3: A cross section of a third embodiment of the apparatus according to the present invention with a curved converter surface.

The cross section of a converter surface 110 shown in FIG. 3 is designed to yield a homogeneous detection efficiency for particles originating from a sample 3, wherein the detection efficiency is the product of the extraction efficiency multiplied by the conversion factor. The extraction efficiency varies across the converter surface. This variation in the extraction efficiency is at least partly compensated by a curved surface, wherein particles which pass at different points through an entrance grid 120, impact on the converter surface with different angles of incidence. To be more specific, particles impact on the converter surface between a distal point 101 with respect to a scintillator surface 130 with a shallow angle of incidence and a proximal point 102 with respect to the scintillator surface 130 close to normal incidence. Hence, the angle of incidence monotonously changes between the distal point 101 and the proximal point 102. This provides a decreasing conversion factor between the distal point 101 and the proximal point 102. Hence, the product of the extraction efficiency multiplied by the conversion factor varies less than the extraction efficiency alone or the conversion factor alone.

Further details of the third embodiment, e.g. the choices of materials and the electrical connections of the grid, the converter, and the scintillator, can be implemented as disclosed for the first or second embodiment, mutatis mutandis.

The invention claimed is:

1. A charged particle detecting apparatus for detecting particles emitted from a sample, said particles comprising positive ions, negative ions and electrons, the detecting apparatus comprising:
   - a housing, said housing defining a chamber in its interior, said chamber confined by conductive walls, said chamber having an opening to the outside of said housing;
   - a grid for selectively attracting charged particles, wherein the grid is electrically biasable with respect to said housing, and wherein the grid is functionally aligned with said opening;
   - a converter arrangement having at least one converter surface, said converter surface being electrically biasable with respect to the grid and with respect to the housing, wherein the converter surface is positioned with respect to the grid and the opening in such a way that charged particles attracted into the chamber by the grid impact on the converter surface; and
   - an electron detector, wherein the electron detector is biasable with respect to the converter surface in such a way that electrons emitted from the converter surface are accelerated towards the electron detector and impact on the electron detector, wherein:
   - said at least one converter surface has a concave shape, in order to provide an angle of impact of particles impacting on the converter surface depending on the point of impact.

2. The charged particle detecting apparatus according to claim 1, wherein:
   - there is no direct impact of any of the charged particles entering the chamber on the electron detector.

3. The charged particle detecting apparatus according to claim 1 or 2, wherein:
   - the electron detector comprises a scintillator.

4. The charged particle detecting apparatus according to claim 3, further comprising:
   - a photomultiplier tube, for receiving the light from the scintillator.

5. The charged particle detecting apparatus according to claims 1, 2 and 4, further comprising:
   - a switchable high voltage power supply, for providing at least two, preferably three, different sets of potentials to bias the grid and the converter arrangement with respect to the housing in order to enable detecting modes for detecting electrons, positive ions, or negative ions respectively.

6. The charged particle detecting apparatus of claim 5, wherein:

the potentials for each mode create an efficient attracting force to particles of this mode for guiding each particle that has passed the grid on a trajectory that hits the converter.

7. The charged particle detecting apparatus according to claims 1, 2 and 4-6, wherein:
the potential between the converter surface and the housing has a fixed proportion factor relative to the potential between the grid and the housing.

8. The charged particle detecting apparatus of claim 7, wherein;
said fixed proportion factor is between 1 and 3.

9. The charged particle detecting apparatus according to 1, 2 and 4-6 claims, wherein:
the grid, the converter, and scintillator are connected by separate high voltage feedthroughs.

10. The charged particle detecting apparatus according to claims 1, 2 and 4-6, wherein:
the grid and converter are connected to a voltage divider which is connected to a high voltage power supply by means of a single high voltage feedthrough.

11. The charged particle detecting apparatus according to claims 1-2 and 4-6, wherein:
the extraction efficiency for secondary electrons emitted from various points of the converter surface varies across the converter surface between a point of the highest extraction efficiency and a point of the lowest extraction efficiency;
the concave shape of the converter surface serves, to provide an angle of impact of particles impacting on the converter surface depending on the point of impact;
particles impacting at a point with a lower extraction efficiency for emitted particles generally have a shallower angle of impact than particles impacting at a point with a higher extraction efficiency;
the conversion factor is higher for shallow angles of impact than for angles of impact closer to the surface normal; and
detection efficiency, which is defined as the product of extraction efficiency multiplied by the conversion factor, varies less across the converter surface than the variation of the extraction efficiency across the converter surface alone or the conversion factor across the converter surface alone.

12. The charged particle detecting apparatus according to claim 11, wherein:
the detection efficiency varies less than a factor of 2 across the surface of the converter, preferably less than a factor of 1.5 and more preferably less than a factor of 1.25.

13. The charged particle detecting apparatus according to claims 1, 2 and 4-6, wherein:
the potential of all elements are chosen such that no primary electron or ion can escape conversion, by falling directly onto the electron detector.

14. A method for detecting charged particles, said particles comprising positive ions, negative ions and electrons by means of a charged particle detecting apparatus, according to claim 1, wherein the detecting apparatus has a housing, a grid, a converter arrangement, and an electron detector in said housing, the method comprising the steps of:
mounting the charged particle detecting apparatus in a beam chamber, said beam chamber having beam source for focussing an ion or electron beam on a sample target, to cause emission of the charged particles; and
electrically grounding housing with respect to the beam chamber; and selectively applying high voltage potentials to the grid, the converter, and the electron detector depending on the particle type to be detected.

15. The method of claim 14, further comprising the step of:
converting the particles entering the housing of the detecting apparatus to secondary electrons by means of the converter wherein the secondary electrons are farther collected and measured by an electron detector.

16. The method of claim 14 or 15, wherein:
the conversion occurs in all three modes, thereby amplifying the number of particles that are detected by the electron detector compared to the number of particles entering the housing.

\* \* \* \* \*